United States Patent
Dryer et al.

[11] Patent Number: 6,146,468
[45] Date of Patent: Nov. 14, 2000

[54] SEMICONDUCTOR WAFER TREATMENT

[75] Inventors: Paul William Dryer, Gilbert; Richard Scott Tirendi, Phoenix; James Bradley Sundin, Chandler, all of Ariz.

[73] Assignee: Speedfam-IPEC Corporation, Chandler, Ariz.

[21] Appl. No.: 09/263,336

[22] Filed: Mar. 5, 1999

Related U.S. Application Data

[63] Continuation-in-part of application No. 09/106,066, Jun. 29, 1998, Pat. No. 6,021,791.

[51] Int. Cl.[7] ........................................ B08B 3/04
[52] U.S. Cl. .................. 134/10; 134/25.4; 134/100.1; 134/110; 134/111; 134/902
[58] Field of Search .............. 134/10, 21, 25.4, 134/26, 100.1, 102.1, 104, 110, 111, 902; 210/150, 151, 188, 195.2, 321.72, 321.73, 321.84

[56] References Cited

U.S. PATENT DOCUMENTS

| | | | |
|---|---|---|---|
| 5,175,124 | 12/1992 | Winebarger | 437/180 |
| 5,261,966 | 11/1993 | Mashimo et al. | 134/2 |
| 5,301,701 | 4/1994 | Nafziger | 134/95.2 |
| 5,336,371 | 8/1994 | Chung et al. | 156/659.1 |
| 5,409,613 | 4/1995 | Weaver . | |
| 5,415,191 | 5/1995 | Mashimo et al. | 134/102.1 |
| 5,419,351 | 5/1995 | Ciari | 134/105 |
| 5,451,291 | 9/1995 | Park et al. | 156/644.1 |
| 5,578,193 | 11/1996 | Aoki et al. | 205/746 |
| 5,593,538 | 1/1997 | Davison et al. | 156/637.1 |
| 5,674,410 | 10/1997 | Nakajima et al. | 216/92 |
| 5,695,545 | 12/1997 | Cho et al. | 95/46 |
| 5,720,869 | 2/1998 | Yamanaka et al. | 205/701 |
| 5,725,753 | 3/1998 | Harada et al. | 205/746 |
| 5,727,332 | 3/1998 | Thrasher et al. | 34/277 |
| 5,938,922 | 8/1999 | Faulk, Jr. et al. . | |

FOREIGN PATENT DOCUMENTS

| | | |
|---|---|---|
| 0 487 247 | 8/1992 | European Pat. Off. . |
| 0 740 329 A1 | 10/1996 | European Pat. Off. . |
| 0 788 143 A2 | 8/1997 | European Pat. Off. . |
| 3-303329 | 2/1991 | Japan ................. 134/902 |
| 3-44927 | 2/1991 | Japan ................. 134/902 |
| 3-191523 | 8/1991 | Japan ................. 134/902 |

OTHER PUBLICATIONS

Assembly Data Sheet for PALL Separel EFM–530 Degasification Module (undated).

Advertisement entitled "AT&T Ultrapure Water Deaerated Using Liqui–Cel Extra–Flow Membrane Contactors" (undated).

David L. Gaskell, Introduction to Metallurgical Thermodynamics, Second Edition, Hemisphere Publishing Corporation, 1991, pp. 555–573.

*Primary Examiner*—Frankie L. Stinson
*Attorney, Agent, or Firm*—Fitch, Even, Tabin & Flannery

[57] ABSTRACT

Method and apparatus for cleaning semiconductor devices and other workpieces using an aqueous rinse solution which is de-oxygenated and hydrogen enriched by passing the aqueous rinse solution and a treatment fluid through an osmotic membrane degasifier. In the preferred embodiment, only a single component, forming gas, is employed to provide both functions of oxygen removal and hydrogen injection.

56 Claims, 9 Drawing Sheets

(d) NICKEL (e) COPPER

SEMICONDUCTOR WAFER TREATMENT

CROSS REFERENCE TO RELATED APPLICATIONS

This is a commonly assigned continuation-in-part of application Ser. No. 09/106,066, filed Jun. 29, 1998 now U.S. Pat. No. 6,021,791.

BACKGROUND OF THE INVENTION

1. Field of the Invention

The present invention pertains to the fabrication of semiconductor wafers and in particular to the control of corrosion of metal structures carried on the surfaces of semiconductor wafers.

2. Description of the Related Art

The commercial production of semiconductor devices on a large scale, typically involves the simultaneous fabrication of multiple product units carried on a single, common semiconductor wafer. Individual raw wafers are formed to the general size and thickness required, and the surfaces are polished to achieve a high degree of flatness. Typically, individual electronic product units are formed on the wafer surface using a photolithographic technique. In order to provide product units which are as compact as possible, photolithographic resolution requires that the wafer be prepared to have a precision surface. As successive layers are built up on the semiconductor surface, the semiconductor wafer at each intermediate stage of production must be polished to regain a relatively high degree of flatness. Semiconductor devices are vulnerable to even very small sized foreign particles, or contaminants, such as chemicals, bacteria, particles and metallic ions.

Some types of contaminants are known to move within semiconductor wafers, while other types of contaminants remain on the surface where interference arises because of their relatively large size compared to the small feature sizes and thinness of the deposited layers on the wafer surface. A variety of techniques are employed to remove unwanted materials, such as surface contamination remaining on the wafer surface.

Cleaning of the wafer surfaces depends upon the nature of the contaminants (such as residues, oxide layers and particulates) to be removed from the wafer surface. Cleaning may involve use of chemical cleaning solutions, water rinses and sprays, mechanized wafer surface scrubbers, and on occasion gas sprays. In addition, immersion rinses, with and without overflow, water sprays and dump rinses have been employed. When drying of the wafer surface is called for, even the drying operation is typically initiated with a brief preliminary rinsing step, often carried out in arrangements commonly referred to as spin-rinse dryers (SRDs).

As will be seen herein, the present invention is directed to the aqueous treatment of a wide variety of commercially important articles, such as liquid crystal displays, flat panel displays, memory storage disk substrates, as well as photographic plates and film. The present invention has found immediate commercial acceptance in the field of semiconductor wafers, especially wafers of a type which are ultimately divided to form a plurality of electronic devices.

During the course of producing commercial semiconductor wafers, layers of various materials are built up on one surface of a wafer blank. These various layers are processed using several different etching techniques, each of which results in a residue which impairs further device fabrication. It is important that such residues be effectively removed.

Typically, the several types of residue are removed with solvents especially adapted for the particular residues. While such solvents are generally effective for removing residues, solvents remaining on the surfaces of the semiconductor device also impair further device fabrication steps.

Accordingly, it is important that the solvents be removed from the semiconductor device and it is known that water rinsing is an efficient means of solvent removal. However, semiconductor device layer materials have changed over the years, and presently semiconductor device manufacturers are employing materials which are subject to corrosion upon contact with water. In an effort to reduce the corrosion problem, carbon dioxide gas has been sparged, i.e., bubbled, into the rinse water to partially lower the pH of the rinse water. However, bubbling carbon dioxide into water rinses used in the semiconductor device fabrication industry has proven to be only marginally successful in reducing the extent of corrosion, and further adds the risk of introducing contaminating particles into solution. In an effort to overcome growing problems of corrosion, the semiconductor device fabrication industry has investigated intermediate rinse steps using non-aqueous rinse solutions. However, such non-aqueous solutions have proven to be less effective than rinse water in removing solvents and wafers are still routinely rinsed with water, despite the corrosion effects.

One example of efforts to improve wafer production involves oxygen removal to reduce oxide growth on the surface of semiconductor wafers. For example, literature describing the PALL SEPAREL Model EFM-530 Degasification Module addresses the reduction of dissolved oxygen in deionized water, in a manner which avoids potential defects to semiconductor devices caused by the formation of unwanted oxide layers. As is known in the art, an oxide layer forms when pure silicon is exposed to an oxygen source, such as dissolved oxygen in a rinse water or other aqueous medium. The oxide layer can change the surface of the silicon from hydrophobic to hydrophilic, a condition which is undesirable in some aspects of wafer processing, such as pre-diffusion cleaning operations. Accordingly, the PALL Degasification Module addresses the need to deoxygenate rinse water to avoid formation of a silicon dioxide layer in the rinse after the wafer is treated with an HF etch solution. As can be seen, the problem addressed by the PALL Degasification Module is not related to problems encountered in controlling corrosion of aluminum, such as pitting and etching, as has been experienced in processing wafers carrying copper/aluminum structures on their surface. While dissolved oxygen is also objectionable from a corrosion standpoint, the corrosion problem is not concerned with the formation of unwanted oxides. A further, more complete system control over wafer processing so as to reduce corrosion in wafers containing copper/aluminum structures is needed.

As will be appreciated from the above, there are numerous opportunities in the course of semiconductor device production for contacting a wafer surface with a fluid or a gas material. In order to attain a successful commercial treatment of the wafers, consideration must be given to several different issues, such as chemical reactivity and corrosion. Despite significant advances, improvements in commercial processing of semiconductor wafers is continually being sought.

SUMMARY OF THE INVENTION

It is an object of the present invention to provide improved treatment of semiconductor wafers during the course of commercial semiconductor device fabrication.

Another object of the present invention is to provide improved corrosion controls when contacting the surface of a wafer with a fluid material, in either liquid or gaseous form.

A further object of the present invention is to provide aqueous treatment of the type described above which removes dissolved oxygen from an aqueous solution while controlling the pH of the aqueous solution.

Yet another object of the present invention is to provide process arrangements of the type described above by employing an osmotic membrane degasifier and using a carrier fluid (preferably a gas) comprised of one or more components, preferably for oxygen removal and, optionally, pH control or other chemical adjustment to the aqueous solutions.

These and other objects of the present invention which will become apparent from studying the appended description and drawing are provided in a method of wafer treatment including contacting the wafer surface with a treatment fluid while reducing the pH of the solution and reducing the electrochemical potential of the solution with respect to conductive structures formed on the surface of the semiconductor wafer so as to preclude corrosion of the conductor traces when contacted with the treatment fluid.

The present invention provides a method of treating metal structures carried on semiconductor substrates, comprising the steps of:

providing an immersion tank;

filling the tank with a fluid media;

immersing the semiconductor substrate in said fluid media;

exchanging at least a portion of the fluid media in contact with the metal structure carried on the semiconductor substrate with fluid media located outside the tank;

contacting said fluid media with a semipermeable osmotic membrane;

contacting said semipermeable osmotic membrane with a treatment fluid so as to draw oxygen from said fluid media to said treatment fluid to prevent oxidation of said metal structures; and reducing the electrochemical potential of said fluid media so as to prevent corrosion reactions in said fluid media.

DETAILED DESCRIPTION OF THE PREFERRED EMBODIMENT

Figure 1:
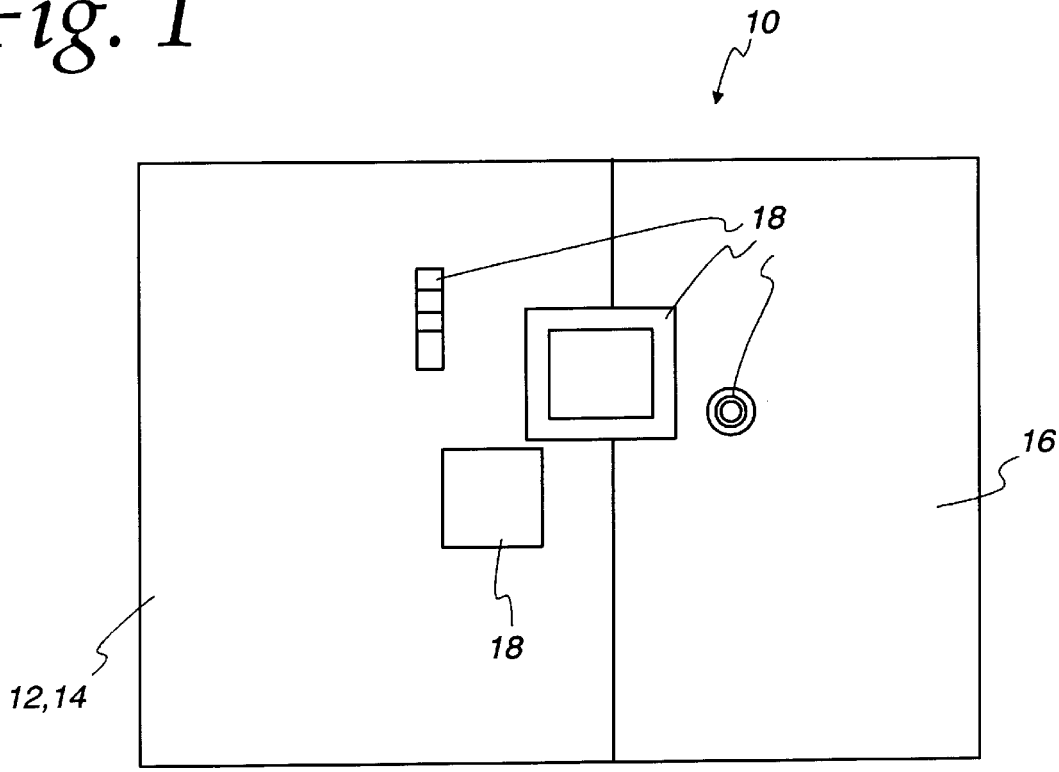
FIG. 1 is a front elevational view of cleaning apparatus according to principles of the present invention.

Semiconductor wafers are typically fabricated by forming a layered series of devices integrated with an underlying semiconductor blank or so-called "prime wafer". With the formation of each layer, the wafer in process must be polished and cleaned in preparation for the next layering step. With ongoing changes in layer materials, new, challenging processing problems have arisen. In general, the unit cost of individual wafers is increasing dramatically and, accordingly, even partial losses of wafers being processed result in an expensive penalty for the wafer fabricator. Unwanted materials, such as contamination particles and residues associated with via etching or metal etching processes, can cause subsequent layering operations to fail. Such residues and contamination particles associated therewith are typically removed using various solvents. The solvents are then removed with one or more rinse solutions, and the present invention has found immediate acceptance in promoting the use of aqueous solutions (i.e., solutions whose composition is either exclusively or predominantly comprised of water) for use in such cleaning and especially in rinsing operations. Water is still the preferred cleaning media. For example, using IPA as an intermediate rinse adds several problems to the process that make its elimination desirable. The IPA adds an additional processing step which increases the production time. Also, it adds cost to buy the chemical and to abate its emission. It is also a poor solvent for the basic chemistries used. Water is the best solvent but traditionally there have been corrosion issues as stated above.

Increasing use is being made of metal structures (such as those of aluminum/copper alloys and proposed all-copper structures) which have greater susceptibilities to corrosion when exposed to water rinses. However, as is widely recognized, there are strong advantages in employing aqueous solutions for wafer rinse. For example, compared to non-aqueous rinses (i.e., rinses not predominantly comprised of water), such as isopropyl alcohol (IPA) or N-methyl pyrrolidone (NMP), aqueous rinse solutions require less investment cost, less safety precautions, are more affordable to dispose of when their useful life has expired, and for many types of popular solvents, aqueous solutions are the most effective rinsing agents for cleaning the wafer surfaces being processed.

In developing the present invention, consideration was given to several corrosion mechanisms encountered in typical semiconductor wafer processing. A standard backend process has four steps. In step 1, metallized wafers are exposed in a basic solvent such as EKC265, EKC830 or ACT935 at about 75° C. for about 15 minutes. The solvent is designated to remove post metal and post via etch residues. In step 2, the wafers are exposed to an intermediate rinse (such as isopropyl alcohol or IPA) to remove most of the solvent (from step 1) from the wafers. Next, in step 3, wafers are exposed to water which rinses the remainder of the solvent and isopropyl alcohol. Finally, in step 4, the wafers are dried. The corrosion of aluminum was studied with reference to the following oxidation/reduction reactions:

$$4Al \rightarrow 4Al^{3+} + 12e^- \qquad \text{(Equation 1)}$$

$$6H_2O + 3O_2 + 12e^{31} \rightarrow 12OH^- \qquad \text{(Equation 2)}$$

$$4AL + 3O_2 + 4OH^- + 6H_2O \leftarrow 4Al(OH)_4^- \qquad \text{(Equation 3)}$$

$$RNH_2 + H_2O \leftarrow RNH_{3+} + OH^{31} \qquad \text{(Equation 4)}$$

$RNH_2$ is the basic amine chemistry used in step 1. When exposed to $H_2O$, $OH^-$ is formed (as seen in Equation 4). When exposed to the aluminum WITH $O_2$ present in the water, the result is corroded aluminum $Al(OH)_{4-}$. The IPA intermediate rinse minimizes the amount of $RNH_2$ entering the rinse, thus minimizing the corrosion. Since not all of the $RNH_2$ is removed from the wafers, some corrosion will occur. Equations 1 and 2 describe the reactions driving the formation of corrosion and corrosion by-products reflected in Equation 3.

With reference to Equations 5–7, another corrosion mechanism occurs in basic chemistries if $O_2$ is not present. In Equation 8, no $O_2$ is present but corrosion still occurs in the form of $AlO_2^-$ with the generation of $H_2$ gas.

$$2Al \leftarrow 2Al^{3+} + 6e^- \qquad \text{(Equation 5)}$$

$$6H_2O + 6e^{31} \leftarrow 6OH^- \qquad \text{(Equation 6)}$$

$$2Al + 6H_2O \leftarrow 2AlO_2^- + 4H_2 + 2H_2O \qquad \text{(Equation 7)}$$

Figure 2:
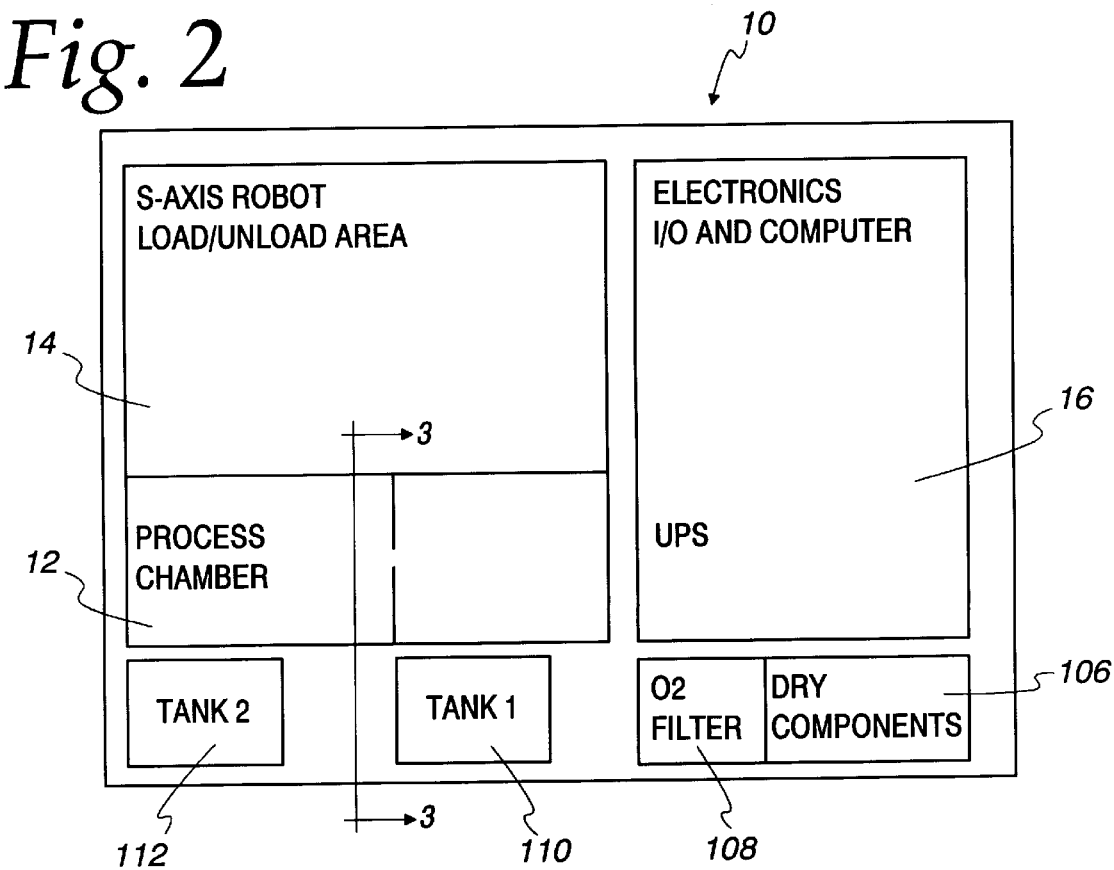
FIG. 2 is a schematic plan view thereof.

Referring now to FIGS. 1 and 2, a wafer treatment apparatus is generally indicated at 10. Apparatus 10 includes a process chamber 12 surrounded by related equipment, to form a practical wafer-treating operation. As can be seen in FIG. 2, a robot load/unload area 14 is located adjacent or above the process chamber and includes conventional robotic placement equipment (not shown) for inserting and removing semiconductor wafers from process chamber 12. Reference numeral 16 is directed to a portion of wafer treatment apparatus 10 which includes an uninterruptable power supply (UPS) and control means, including a computer, and electronics input/output capability which is accessed by switches and other controls 18 located on the outside of the enclosure cabinet, as can be seen, for example, in FIG. 1.

Figure 3:
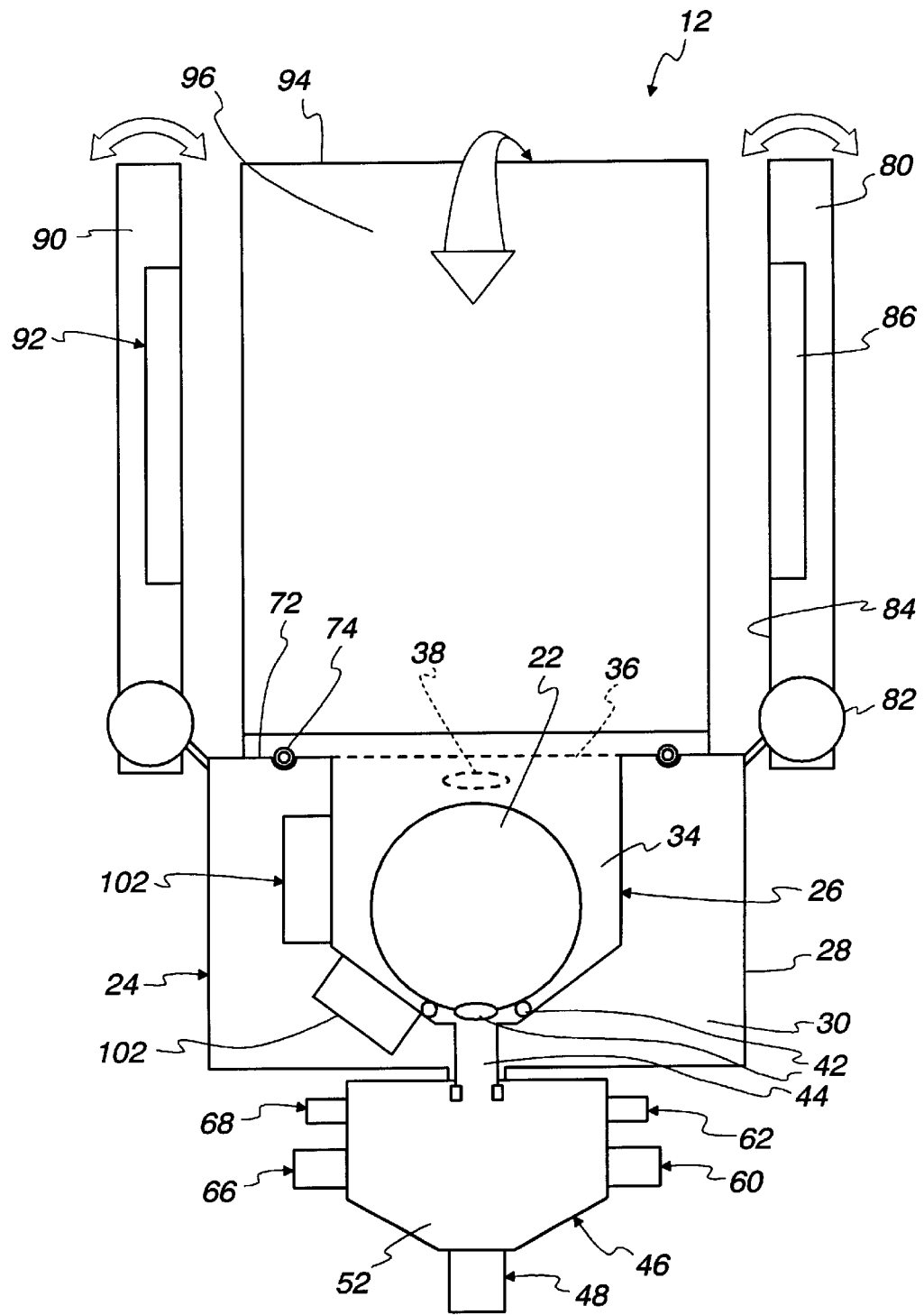
FIG. 3 is a cross-sectional view taken along the line 3—3 of FIG. 2.

Turning now to FIG. 3, the process chamber 12 is shown in greater detail. Although different processes can be carried out with chamber 12, it has found immediate application for immersion, chemical treatment, cleaning, rinsing and drying of semiconductor wafers, such as wafer 22 shown in FIG. 3. Chamber 12 includes a body generally indicated at 24 comprising a receptacle 26 and an outer, surrounding enclosure 28. Body 24 defines a hollow interior 30 which preferably is hermetically sealed and exhausted to a suitable control system.

Receptacle 26 is preferably made of quartz material or other non-reactive material and is formed to define a wafer-receiving cavity 34 having an upper opening 36 through which wafers or other workpieces pass as they are inserted and removed from cavity 34. A weir opening 38 is formed adjacent the upper end of receptacle 26 and directs overflow in a manner to be described below with reference to the schematic diagram of FIG. 4. One or more wafers 22 are supported at their bottom edge on furniture or support members 42 located adjacent a passageway 44 communicating with a plenum 46 which is located beneath body 24. A fast drain valve 48 is located at the lower end of plenum 46.

As can be seen in FIG. 3, passageway 44 connects cavity 34 with an interior volume 52 of plenum 46. A fast flow valve 60 and a slow flow valve 62 communicate with interior 52 and are operated to fill plenum 46 with an aqueous medium, preferably deionized water treated in a manner to be described herein. Also coupled to the interior 52 of plenum 46 is a fast flow valve 66 and a slow flow valve 68, used to fill plenum 46 with a chemical, such as solvents or a non-aqueous rinse solution, such as isopropyl alcohol (IPA). In operation, plenum 46 is first filled with a desired solution, with the level eventually rising past passageway 44 to enter cavity 34. The liquid level may be maintained within quartz receptacle 26 at any step of a process or may intentionally cause overflow to pass through overflow weir 38. Workpieces and solutions within receptacle 26 are excited by conventional means, such as sonic, preferably ultrasonic or megasonic transducers 102, to enhance the cleaning or other processing operations.

An upper wall 72 of body 24 includes a recess for a conventional sealing gasket 74. A plurality of lids, preferably two lids and most preferably three lids, are hingedly joined to body 24 adjacent upper surface 72 and are selectively movable, one at a time, to sealingly enclose the upper end 36 of receptacle 26. As will be seen herein, each lid is operable to enclose cavity 34 to provide a wide range of environments within the receptacle cavity. For example, processing lid 80 hingedly connected at 82 to body 24 is closed during cleaning or other processing of wafer 22. In order to prevent condensation on the lid inner surface 84, lid 80 is provided with a blanket heater 86. The lid 80 confine a pressurized gas blanket on top of the liquid surface within cavity 34. The gas blanket is introduced into the cavity by conventional nozzle means in the process lid or cavity wall. The gas blanket can be comprised of a suitable non-reactive purge gas, such as nitrogen, or, if desired, can be comprised of carbon dioxide so as to provide pH control if the liquid surface within cavity 34 is broken, as during a rapid cavity-filling operation. Optionally, the processing lid 80 can include apparatus for purging ambient environment from cavity 34 preparatory to a processing operation.

Drying lid 90 is lowered to engage gasket 74 and enclose upper opening 36 of cavity 34 during wafer drying operations. Lid 90 includes conventional wafer drying equipment of the "MARANGONI" or surface tension gradient drying type, but other types of drying apparatus, such as heat lamps, super heated vapor, or spin drying can also be used. One example of drying lid 90 is given in U.S. Pat. No. 5,634,978, the disclosure of which is incorporated by reference as if fully set forth herein.

The preferred lid 90 includes an assembly 92 of nozzles injecting a final rinse solution, either aqueous one having a relatively low vapor pressure, such as isopropyl alcohol, and a heated inert drying medium, such as nitrogen gas. A third, load lid 94 is used during load/unload operations and includes an inner surface on which wafer cassettes, carriers or other load/unload equipment may be temporarily placed. However, if working surfaces are otherwise provided, or if sufficiently capable robotic equipment is used for loading and unloading, lid 94 may be rendered unnecessary and can be omitted, if desired.

Referring again to FIG. 2, various components associated with the drying equipment located in assembly 92 are identified in FIG. 2 by reference numeral 106. The components 106 are coupled by means not shown, to assembly 92 in lid 90. As mentioned, valves 60, 62 introduce aqueous media into receptacle 26. In order to provide improved control over oxidation reactions with layered, metal-bearing structures (e.g., aluminum or copper) carried on wafer 22, the aqueous media in contact with wafer 22 is, according to one aspect of the present invention, treated by an oxygen filter in the form of an osmotic membrane degasifier indicated by reference numeral 108 in FIG. 2. The aqueous media (preferably conventional deionized water) is passed over a semi-permeable membrane, such as membranes available from Hoechst Celanese for use with their LIQUI-CEL Membrane Degasifier, the osmotic membrane degasifier preferred in carrying out the present invention. Similar osmotic membrane degasifiers may also be commercially obtained from Pall Corporation of East Hills, New York, under the trade designation "SEPAREL" and W.L. Gore & Assoc. in Elkton, Md. under the trade designation "DISSOLVE".

In the several treatment steps discussed herein, aqueous media from the cavity is passed over one side of the semi-permeable membrane in degasifier 108 while a treatment or carrier fluid, preferably a gas at a pre-selected temperature and pressure, is caused to flow over the opposite side of the semi-permeable membrane. One type of carrier gas is comprised of one or more components and preferably carries out several purposes. The first type of carrier gas "carries" or "pulls" dissolved oxygen from the aqueous media being treated. Thus, oxygen (or other dissolved gas) from the aqueous media is made to selectively diffuse across the semi-permeable membrane so as to enter the carrier gas stream located on the opposite side of the membrane. Preferably, the flow of carrier gas is set so as to maintain the highest practical diffusion rate across the membrane, preventing oxygen levels on the carrier gas side of the membrane from reaching equilibrium with the carrier gas.

The carrier gas may be selected for its ability to diffuse in a reverse direction across the semi-permeable membrane, so as to quiescently inject beneficial additives into solution in the aqueous media. Most preferably, the carrier gas is selected such that, upon dissolving in the aqueous media it will act to alter the aqueous media pH value in a manner which further precludes corrosion of the wafer structures. The treatment or "carrier" gas comprises a mixture of two gases, one for causing dissolved oxygen in the aqueous media to flow across the osmotic membrane and the second to alter the pH value when introduced into the aqueous media.

The first component can be comprised of virtually any gas or liquid other than oxygen so as to create the desired osmotic pressure across the membrane, and the second component most preferably comprises carbon dioxide, but may also comprise ammonia, nitrous oxide, nitric oxide and carbon monoxide. Thus, preferably, the carrier gas of the present invention employed for use with semiconductor materials comprises a mixture of carbon dioxide and nitrogen gas. This carbon dioxide mixture is one example of a carrier gas meeting one requirement of the present invention, that of "pulling" oxygen from the aqueous media through the semi-permeable membrane, while passing an effective pH modifier through the membrane in an opposite direction.

The carrier gas can provide further useful functions. For example, it has been observed that gas entrained in the aqueous media provides a more efficient coupling of agitation energy, such as sonic energy, including energy at ultrasonic and megasonic (i.e., megahertz) frequency regimes. As pointed out above, dissolved oxygen can be a poor choice for agitation enhancement. However, a benign gas can be dissolved in the aqueous media, upon its passage through the osmotic membrane.

Once in solution with the aqueous media, the carbon dioxide emerging through the membrane removes OH⁻ shown in the above equations, and especially Equation 3. However, unlike carbon dioxide sparging or bubbling, potentially contaminating particles are not introduced into the wafer-contacting aqueous media. Further advantages over sparging techniques are also possible. For example, by passing through the semi-permeable membrane of the present invention, carbon dioxide is introduced into the aqueous media in a finer molecular level form. Accordingly, carbon dioxide is more completely dissolved in the aqueous media and is more quickly and thoroughly mixed. Further, carbon dioxide is introduced into the aqueous media quiescently, without bubbles. In addition to slowing or otherwise impairing dissolving of the encapsulated CO₂ gas, bubbles introduced by sparging or the like bubbling technique might be carried to the wafer surface to form an effective barrier, at least partly blocking intimate contact of the wafer surface with the treating solution.

In order to provide a wide range of control of pH values, the preferred carrier gas, as mentioned, comprises a mixture of carbon dioxide and a diluent, such as nitrogen gas, which allows the oxygen transfer rate to continue across the membrane while holding the aqueous media pH value at a constant level. As can be seen from the above, the $CO_2$ gas is introduced into the aqueous media to provide pH control. Chemicals may also be passed through the osmotic membrane to achieve desired objectives other than pH control. For example, a desired surfactant may be introduced in liquid or gaseous form in the carrier stream and, upon passing through the osmotic membrane, will be quiescently added to the aqueous media. If desired, additional control may be provided by employing other, conventional pH control methods directly in the process chamber. For example, a carrier gas mixture of 4% hydrogen gas and 96% nitrogen gas can be used to provide a more reducing environment, which is less likely to permit corrosion. As a further example, an injection apparatus can be provided within cavity 34 to introduce a buffer or ion exchange solution. Optionally, an acid or base drip can be added to one of the lids covering the cavity.

In addition to the above equations, consideration is also given to the increasing use of copper and copper alloys as structures layered on semiconductor substrates. From a device manufacturer's standpoint, increased copper content provides increased conductivity and hence increased speed of electronic operation. The demand for copper content of copper/aluminum alloys is steadily increasing and it is possible that metal lines formed on semiconductor substrates may be comprised entirely of copper metal. As is well known, even small percentages of copper undergo substantial corrosion when contacted with water containing dissolved oxygen. When such small amounts of copper (components greater than 1% of the total alloy) are added to aluminum, an observed galvanic reaction between copper and aluminum operates to seriously increase the corrosion rate of the aluminum component.

$$Cu_{(s)}+Al_{(s)} \rightarrow Cu^{\delta-}+Al^{\delta+} \qquad \text{Equation 8)}$$

Once the aluminum component becomes positively charged, the electrons are attracted in the p-orbital of the rinse water $O_2$ molecule. By effectively removing dissolved oxygen from the aqueous media, the present invention eliminates these types of corrosion reactions.

It has also been observed that the corrosion reaction rate displays photochemical sensitivity. Attempts to quantify the photoreactivity of the various corrosion reactions have not been studied in detail, but even so, the observed photoreactivity role is pronounced in conventional semiconductor cleaning operations. The process chamber 12 is constructed such that the interior of receptacle 26 is sealed in a light-tight as well as an air-tight condition, using lids which carry out multiple functions beyond merely blocking ambient light.

As mentioned above, wafers 22 to be processed may be sprayed, but are preferably immersed in solution contained within receptacle 26. This provides several advantages. Due to the chemical sensitivity of materials employed, and ever tightening constraints on process parameters, management of so-called "backside" wafer contamination is becoming increasingly important if wafer losses are to be controlled. By providing an immersion cleaning of wafers 22, issues of backside contamination are eliminated in a cost effective rapid manner, since all exposed surfaces of the wafer are cleaned simultaneously.

Further, dislodged particles are managed with greater control so as to prevent their re-introduction on the wafer surface. For example, referring to FIGS. 2 and 4, tanks 110, 112 are located adjacent process chamber 12 and are coupled to the process chamber with a plurality of supply and return lines. Tank 110 is coupled to plenum 46 by a return line 116 and by a supply line 118 which includes a pump 120 and filter 122. A second return line 124 couples tank 110 to weir outlet 38. Tank 112 is connected to plenum 46 through return line 126 and through supply line 128 associated with pump 130 and filter 132. A second return line 134 couples tank 112 to weir outlet 38. Tanks 110, 112 have supply inlets 140, 142 to a bulk chemical source (not shown).

Figure 4:
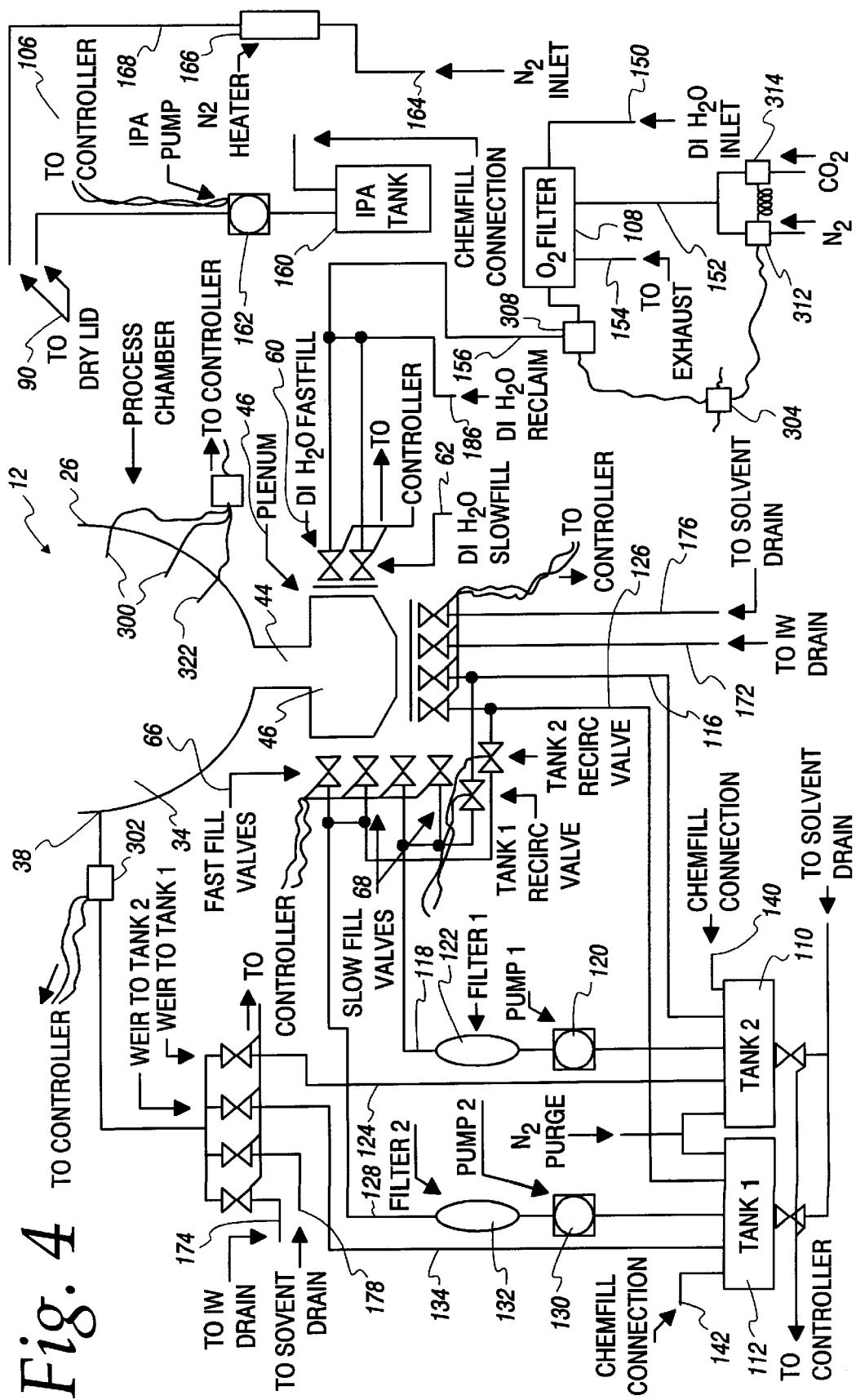
FIG. 4 is a schematic diagram thereof.

Referring to the bottom right corner of FIG. 4, a deionized water inlet 150 and a carbon dioxide mixture inlet 152 are provided for the osmotic membrane degasifier 108. The carbon dioxide mixture or other carrier gas entering inlet 152 passes across the membrane internal to degasifier 108 and exits through exhaust 154. A portion of the carrier gas, along with the water introduced by inlet 150, exits through line 156 which is coupled to valves 60, 62. Preferably, inlets 150, 152 include temperature control (e.g., heating) capability coupled to controller 304. In addition to providing control of the aqueous media in cavity 34, heating control at inlets 150, 152 controls the diffusion rates and bi-directional selectivity of the osmotic membrane.

Referring to the upper right-hand portion of FIG. 4, drying equipment 106 includes a rinse agent tank 160 and a pump 162 which are coupled to assembly 92 mounted in lid 90. As mentioned, the rinse agent preferably comprises isopropyl alcohol. The drying gas, preferably $N_2$, enters through inlet 164 and is heated in heater 166, thereafter being conducted through line 168 to assembly 92 in lid 90.

As noted above, it is preferred that all wafer-contacting chemistries are introduced into cavity 34 from plenum 46. In this arrangement, points of entrapment are eliminated as are direct chemical connections to receptacle 26, thereby avoiding the attendant possibility of mis-operation. As will be seen below, it is generally preferred that cavity 34 be operated as a recirculating immersion process chamber as well as an overflow immersion rinse bath. Although not preferred for the treatment of semiconductor wafers, cavity 34 can be operated in a spray contact or waterfall mode, with conventional nozzles located in the interior of cavity 34 and/or the lids associated therewith.

As can be seen from the above description of FIG. 4, several recirculation loops are provided with the arrangement of the present invention and it is contemplated that the treatment apparatus may comprise a totally closed system. However, it may also be advantageous from time to time to discard certain portions of the processing or rinsing agents employed and connections to an industrial waste water drain are provided by line 172 (exiting a manifold at the outlet of plenum 46) and line 174 (coupled to the weir discharge 38). Connections to a separate solvent drain are provided by line 176 exiting plenum 46 and line 178 coupled to tank weir outlet 38.

As will be appreciated from the foregoing, chamber 12 can be operated in a number of different ways. For example, wafer treatment can be limited to post solvent wafer rinse. However, it has been found unnecessary to perform residue-removing solvent cleaning at a separate location. Rather, residue is preferably removed from the wafer using solvent in chamber 12, followed by a solvent-removing rinse and concluding with a wafer drying operation. Initially, cavity 34, passageway 44 and plenum 46 are emptied, cleared of all liquids. If desired, a purge gas can be employed, filling the cavity, passageway and plenum.

In preparation for a wafer transport operation, load lid 94 is opened and one or more wafers 22 are inserted in cavity 34, so as to rest on furniture supports 42. In an optional pre-treating step, the empty plenum 46 is then filled with a first solvent solution, preferably taken from tank 110 and passed through filter 122. Solvent is introduced so as to eventually fill plenum 46, passageway 44 and the interior or cavity of receptacle 26. Tank 110 preferably contains used solvent, captured from a previous secondary solvent cleaning operation, as will be seen herein. This initial contact with the wafer causes the highest concentration of residue and contaminating particles to enter into solution within cavity 34. It is anticipated that, in many commercial operations, this initial pre-treatment solution will be discarded. Depending upon the flow conditions within cavity 34, the initial pre-treating solution may also exit cavity 34 through overflow weir 38. Alternatively, cavity 34, passageway 44 and plenum 46 may be drained by line 176.

In certain instances, the pre-treatment operation may be unnecessary, in which case pump 120 is energized so as to withdraw used solvent from tank 110, which, after exiting filter 122, fills plenum 46 and ultimately cavity 34. After a sufficient period of ultrasonic agitation, the solvent is either returned to tank 110 through line 116 or is discharged to the solvent drain through line 176. It is generally preferred during all stages of wafer cleaning that wafer 22 be maintained fully immersed and further that cavity 34 be filled so as to cause a controlled overflow through weir 38. Overflow solvent can be returned to tank 110 through line 124 or the overflow can be discharged to solvent drain through line 178.

If desired, conventional particle counters 300 (see FIG. 4) such as those commercially available from Particle Measuring Systems (PMS) located at Boulder, Colorado can be employed to monitor contents of cavity 34 to aid in the decision whether to retain or discard the overflow and/or the cavity contents. Alternatively, conventional chemical monitoring systems 302 may be coupled to controller 304, to sample the chemistry to detect the concentration of each chemical component using an FPM Analytics, Inc. chemical analyzer from Buffalo Grove, Illinois. The FPM analyzer provides information about the change in the chemical components over time. Each chemistry has several components. If any of the components change, the chemistry will be harmful or inactive to the wafers. Monitoring each component allows discarding of the chemistry once the components are out of specification.

At the conclusion of the first cleaning stage, with the reused solvent being withdrawn from the plenum 46 and tank cavity 34, "cleaner" solvent in tank 112 is passed through pump 130 and filter 132 to plenum 46 and the level is allowed to rise, filling cavity 34, fully immersing wafer 22 and causing a controlled overflow through weir outlet 38. Weir overflow may be returned through line 134 to tank 112 or may be discharged to a solvent drain through line 178. At the conclusion of the second stage of wafer cleaning, the wafer may be immersed, sprayed, washed or otherwise "reused" with virgin solvent from a bulk supply. The tank cavity passageway 44 and plenum 46 are then drained of all solvent. The solvent is preferably returned to tanks 110 and/or 112 through lines 116, 126 but may be discharged to a solvent drain through line 176, if desired.

Thereafter, wafer 22 is rinsed with an aqueous rinse solution to remove solvent from the wafer surface, wafer cavities and other structures carried on the wafer substrate. An aqueous media such as deionized water is processed in osmotic membrane degasifier 108, as described above. A flow of deionized water enters through inlet 150 and a flow of carbon dioxide carrier gas enters the degasifier through inlet 152. Oxygen enriched carrier gas exits degasifier 108 through line 154 and the oxygen-depleted, pH-balanced deionized water exits degasifier 108 on line 156. The aqueous solution, thus treated, may be stored on site, if desired. Preferably, however, the aqueous solution is used on demand, as needed. As with other solutions contacting the device being treated, the modified deionized water fills plenum 46, passageway 44 and cavity 34, immersing wafer 22. Preferably, a controlled overflow is maintained through weir opening 38, being directed through a manifold coupled to exit line 174, thereby being passed to an industrial waste water drain. If desired, overflow can be filtered and redirected through pumping (not shown) to a deionized water reclaim inlet 186, although this has been found to be unnecessary due to the cost efficiencies of employing deionized water as a rinse agent.

Figure 5:
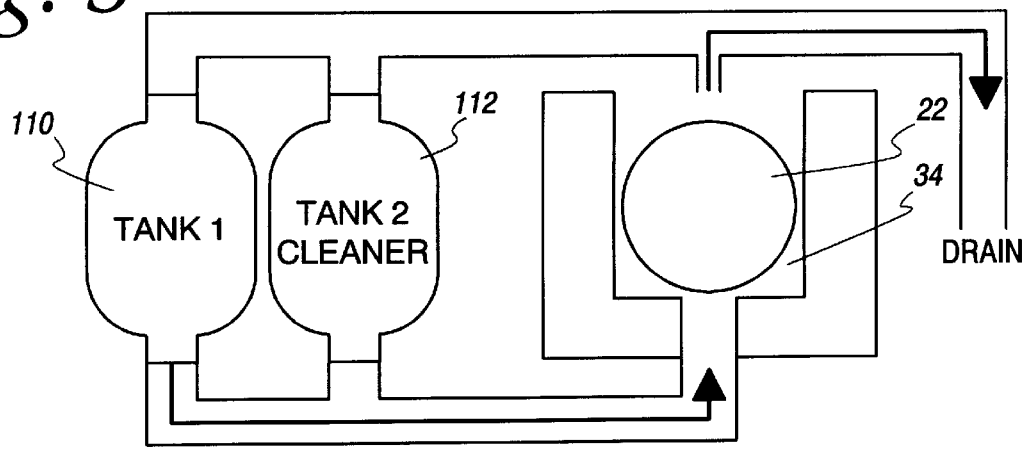
FIGS. 5–8 show a sequence of operation.

FIG. 5 shows an initial wafer contacting operation in which reused solvent from tank 110 fills cavity 34. This initial contact with the wafer contains the majority of dissolved polymer, with polymer concentrations substantially higher than those found in tank 110. Accordingly, it may be desired to discharge the initial contacting solvent to the solvent drain as indicated. Thereafter, the overflow solvent is recirculated back to tank 110 and preserved for reasons of economy. If desired, the solvent could also be directed to a suitable solvent drain.

Figure 6:
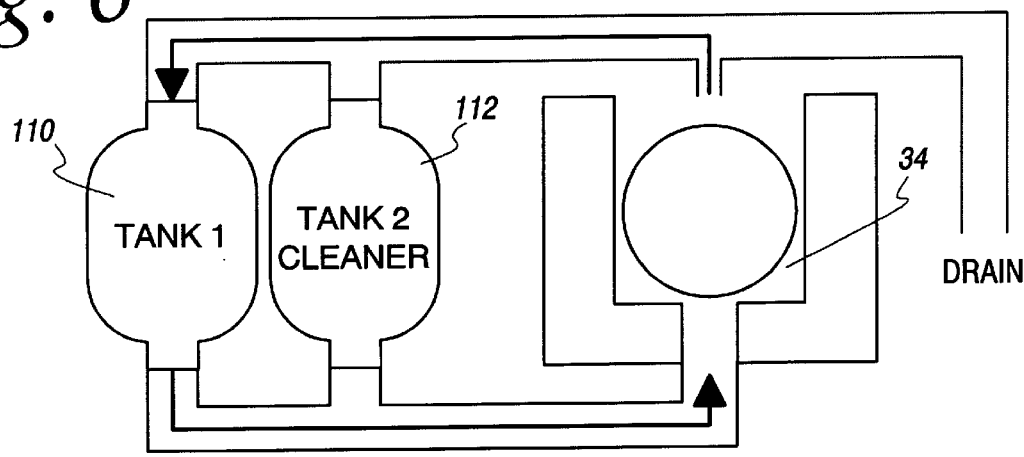

Although the solvent represented in FIG. 6 is reused and therefore contains certain concentrations of dissolved residues, the concentrations of residue are relatively small compared to the concentrations obtained upon initial wafer contact as considered above with reference to FIG. 5. It is generally preferred that most, if not all, of the residues on the wafer be removed in the step indicated in FIG. 6, i.e., with reused solvent.

Figure 7:
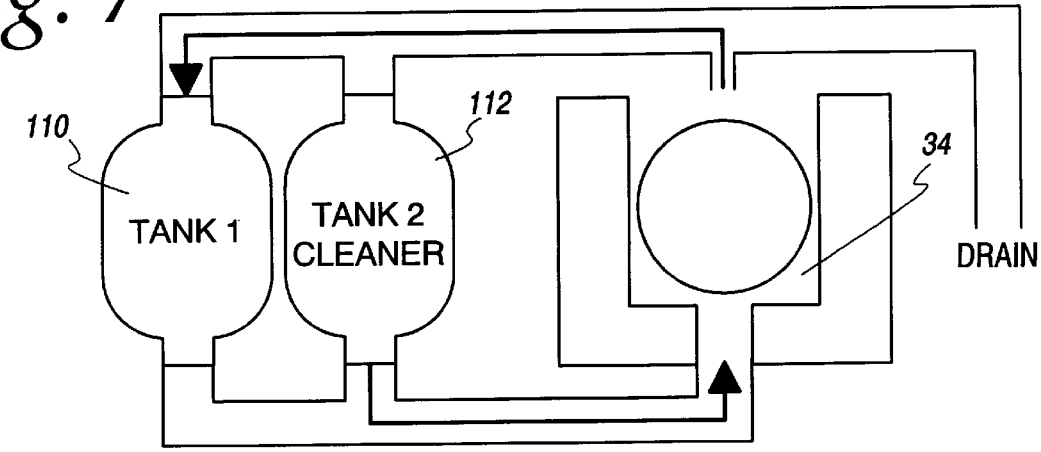

Only after the residues are removed from the surface of the wafer being treated is cleaner solvent applied to the wafer, as indicated in FIG. 7. Use of fresh solvent eliminates the possibility of dropping dissolved polymer residue out of solution or interrupting the suspension of polymer in solvent which is not yet filtered. The preferred purpose of introducing cleaner solvent from tank 112 is to remove dirty solvent prior to recirculating the chemistry. As indicated in FIG. 7, it is preferred to capture the "cleaner" solvent from tank 112 in tank 110, for use on the next cleaning cycle.

As will be appreciated, the chemistry now present in contact with the wafer is cleaner than conventional dual tank bench configurations, because the volume within the tank is continually topped off with fresh chemistry from a bulk source. As can be seen from the diagram of FIG. 4, it is also possible to use virgin solvent chemistry exclusively, prior to the aqueous rinse step.

Figure 8:
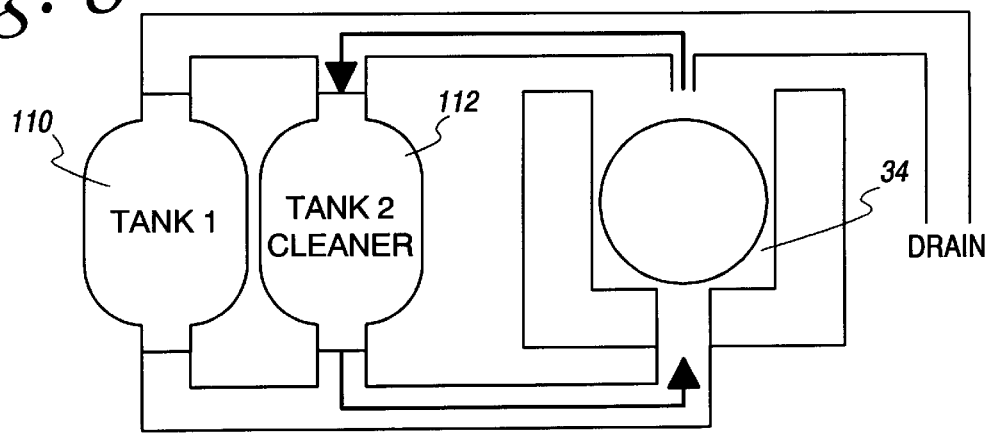

Referring to FIG. 8, as a final solvent cleaning step, fresh, unused solvent is introduced and recirculated with respect to tank 112. It is preferred that solvent filling the cavity, passageway and plenum are returned to tank 112 for future use. Thereafter, the aqueous rinse and drying steps described above are carried out. During this time, tank 112 is "topped off" from a bulk solvent source, if desired. As will be appreciated, fresh solvent introduced into tank 112 will have benefit of a substantial residence time for any desired mixing, heating, or other temperature control prior to its application in a subsequent process cycle.

In order to maintain the proper chemical component ratios of the solvent as long as possible, the present invention allows the cleaning step to be carried out with a minimum exhaust and purge, which might otherwise cause a loss of quality or quantity of solvent due to evaporation or decomposition associated with oxygen and water content in surrounding air. Thus, as can be seen, the present invention provides improved chemistry management by controlling the chemistry environment during a cleaning operation.

Certain variations and alternative arrangements are possible. For example, operation of the osmotic membrane degasifier 108 can be automated using conventional techniques so as to minimize consumption of carrier gas. For example, as mentioned, it is preferred that a mixture of carbon dioxide and nitrogen gas be used for the carrier, at a flow rate which assures adequate diffusion rates of oxygen across the membrane. If desired, conventional metering 308 to sense dissolved oxygen can be provided on line 156 and the flow rates of the carrier gas at inlet 152 can be adjusted with control signals applied to $N_2$ and $CO_2$ flow controllers 312, 314, respectively. For example, if objectionable oxygen levels are detected in line 156, the flow rate of carrier gas can be increased in order to increase osmotic pressure, thereby withdrawing higher rates of dissolved oxygen from incoming aqueous solution. On the other hand, if dissolved oxygen content in line 156 is sufficiently low, it may be possible to reduce the input flow of one or more carrier gas components and still achieve the desired levels of oxygen removal in line 156.

As a further variation, the carbon dioxide and nitrogen components of the carrier gas can be mixed as needed and fed into inlet 152. Conventional pH meters can be incorporated in metering 308 to sense the pH of aqueous media in line 156 and the $CO_2$ component of the carrier gas can be adjusted by operation of flow controller 314 to attain the desired pH level. Any undesired reaction in osmotic pressure (needed to remove dissolved oxygen) can be effectively dealt with by independently adjusting the nitrogen gas flow component (by signals to flow controller 312), since both carbon dioxide and nitrogen gas components of the carrier gas are effective in maintaining the desired osmotic pressure needed for effective oxygen removal from the aqueous solution in degasifier 108.

If desired, the pH monitoring output and dissolved oxygen monitoring outputs from metering 308 can be considered together either by an operator or more preferably by computer controlled automation 304 to vary the flow rates of the components of carrier gas entering inlet 152. Of course, such automated control could operate to prevent aqueous media in line 156 from entering process chamber 12 if the dissolved oxygen and/or pH levels exceed predefined control points.

As mentioned above, particle counters 300 and chemical monitoring sensors 322 of predictors indicating the concentration of dissolved residue can be employed in cavity 34 or in the effluent of overflow exiting weir 38. As indicated in the above discussion, it is contemplated that automated control attention be given to the varying concentrations of contaminant particles and residue levels in cavity 34, and that control steps be taken to segregate (preferably discard) materials containing unacceptably high concentrations of contaminant particles and/or dissolved residue.

Contaminant levels (either particles or dissolved residue) can be estimated based on their residence time in contact with the wafer or other workpieces immersed within cavity 34. For example, consideration is given to the fact that the material filling cavity 34 be inputted in the plenum 46 at a rate so as to assure a desired rate of overflow passing through overflow weir 38. Overflow materials initially appearing at weir 38 can, for an initial period of time, be diverted away from a recirculation loop or storage container and thus be prevented from coming into contact with lesser-contaminated solution.

However, using conventional automation techniques, greater efficiencies can be obtained by directly monitoring the contamination levels within cavity 34 and/or effluent from overflow weir 38. Particle counters and/or automated chemical monitors of dissolved residue can be employed to provide a more efficient use of solution by preventing the unnecessary disposal of solution initially contacting the wafer surface. In this manner, greater flexibility of operation is possible and wafers of differing compositions and surface properties can be accommodated with a single routine production schedule.

With the introduction of automated metering and other controls, it may be possible to consider a replenishing of treatment materials employed in the process chamber. Decisions can be made based upon the contaminant levels (either particles in solution or dissolved chemistries) as to whether it is cost effective to attempt to reclaim the solution in question. For example, it may be observed that solvents and rinse solutions contain acceptable levels of chemical components, but unfortunately carry unacceptably high levels of contaminant particles. The solutions in question can be directed through conventional filtering equipment and retested to certify their acceptability for re-introduction in subsequent processing stages. It may also be possible to perform the same reclamation, by chemically treating the solution in question so as to remove or reduce unwanted dissolved chemistries.

Automated instrumentation can also take into account the need for make-up of solutions flowing through tanks 110 or 112, for example. Calculations can be made as to the net effect on ultimate contaminate levels and it may be possible from time to time to prevent the unnecessary discarding of process solutions by diluting with fresh chemistries, thereby providing savings relating not only to the cost of replacement solutions but also of waste handling. It will be appreciated by those skilled in the art that such automated instrumentation can be provided using conventional techniques, in a space-efficient manner which would not contribute considerably to the space requirements for the processing equipment.

It will also be readily appreciated by those skilled in the art that the oxygen filter (e.g., osmotic membrane degasifier), along with optional automated controls, can be used in stand-alone mode to provide a stored quantity of treated aqueous material. Further, the oxygen filter can be incorporated in arrangements other than those shown herein. For example, conventional wafer polishing operations can benefit from the incorporation of the oxygen filter according to principles of the present invention, and it will be appreciated in this regard that substantial reduction of wafer handling is thereby made possible. If desired, further advantages may be obtained by combining the oxygen filter and process chamber of the present invention, incorporating the combination, for example, in existing wafer processing operations.

In commercial processing of semiconductor wafers to produce integrated circuits and other commercially important devices, wafers and metal traces carried on the wafer surfaces are subjected to several photolithographic processing solutions needed to define and build up layers of various materials on the wafer surface to produce electronic devices. These solutions, usually pH basic, are carried on the wafer surface as the wafers are immersed in the aqueous media, such as a deionized water bath. At times, ultrasonic excitation of the aqueous media is employed to speed the cleaning process.

Because the surface features tend to capture the developers and other solutions, all of the basic solution carried on the wafer may not be immediately released from the wafer surface, and the local pH value of the rinse water typically fluctuates from one moment to the next. Even with attempts to circulate the aqueous media within the treatment vessel, local elevated basic concentrations are observed.

Even though the role of the aqueous media is to rinse the wafer surfaces, initially, the aqueous media in the cleaning tank becomes very basic, very quickly, and rinsing is not achieved. During following moments in the rinsing operation, fresh rinse water is pumped into the vessel while old rinse water is allowed to flow over a weir located at the top of the vessel and, accordingly, continuous monitoring of the solution is necessary due to the changing conditions. While it may be possible to monitor the concentration of metal ions in solution in order to identify the presence of corrosion during wafer treatment, it is possible that at least some of the corrosion might result in the formation of an oxide layer on the wafer surface with the metal ion formed in the corrosion process being trapped within an insulative coating, thus preventing their direct detection. Rinsing is considered completed when the resistivity of the water eventually reaches a defined threshold, e.g., 10 megohms (water is considered to be "pure" at 18 megohms).

In a second treatment method, the aqueous media is acted upon by a treating fluid employed in a semi-permeable membrane separator. As in the first treatment method, the treating fluid again carries out two distinct functions. The treating fluid employed in the semi-permeable membrane is chosen so as to remove oxygen from the fluid media (preferably deionized water) which contacts the semiconductor wafers in a cascade immersion cleaning of the semiconductor wafer surfaces. The treatment fluid also provides a diffusion flow of hydrogen across the semi-permeable membrane, so as to quiescently inject the hydrogen into the fluid media so as to drive Equation 8 in an opposite direction, further preventing the conversion reaction.

In the second treatment method, the fluid media is passed over one side of the semi-permeable membrane in degasifier 108. The treatment fluid can be liquid, a single component gas, or a multi-component gas comprising a carrier gas (primarily for removing oxygen) and a second gas (primarily for introducing hydrogen into the aqueous media). As in the preceding treatment step, the treatment gas "pulls" dissolved oxygen from the aqueous media being treated, causing the oxygen (or other dissolved gas of interest) to selectively diffuse across the semi-permeable membrane so as to enter the treatment gas stream located on the opposite side of the membrane. Flow conditions are established so as to maximize the oxygen diffusion rate.

Both oxygen removal and hydrogen supply are preferably provided in a single component gas already in use for diffusion operations, typically referred to as "forming gas", $H_2+N_2$. The forming gas is distributed in semiconductor fabrication markets for unrelated, diffusion operations and is available at a commercially attractive bulk product price. When forming gas ($N_2H_2$) is used to deoxygenate the water with a membrane degasifier according to one aspect to the present invention, there are two major benefits. First, $O_2$ is removed from the rinse water. Since the $O_2$ is removed, the corrosion reaction in Equation 3 is prevented from moving to the right, thus blocking this corrosion mechanism. Secondly, forming gas adds $H_2$ to the water which creates an excess on the right side of Equation 8. According to Le Chatelier's principle, an excess of reactants on either side of an equation will force the reaction in the opposite direction. Therefore, Equation 8 will be forced to the left preventing the formation of AlO2 (corrosion by-product). The forming gas therefore prevents both corrosion mechanisms.

The treatment gas can also comprise a mixture of at least two component gases so that individual control of each component can be optimized in a cost efficient manner. The first component of the treatment gas can be comprised of virtually any gas or liquid so as to create the desired osmotic pressure across the semi-permeable membrane, needed for oxygen withdrawal. Any of the elemental inert gases (except oxygen) are satisfactory. The second component of the treatment gas can comprise any material with weakly bonded hydrogen such as $H_2S$ and can also comprise gaseous hydrogen.

Figure 9:
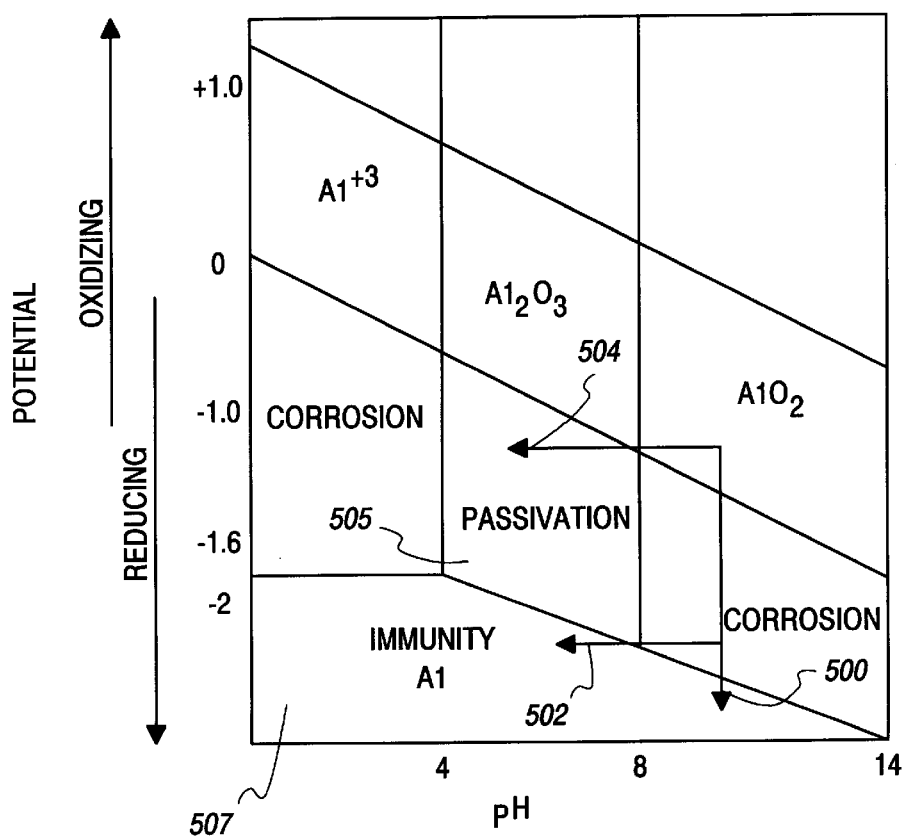
FIGS. 9–13 show Pourbaix operating diagrams for a variety of metal structures.

One explanation for the effectiveness of the second treatment method will now be given with reference to the simplified Pourbaix diagram for aluminum, shown in FIG. 9. In the simplified Pourbaix diagram, electrochemical potential is plotted against pH and simplified operating zones have been identified for various numerical values plotted. For example, a four-sided passivation operating region is defined by corner operating points expressed as (chemical potential, pH) values of: $-0.7$, 4), (1.0, 8.0), ($-2.1$, 8) and ($-1.8$, 4). Operating zones in which corrosion is experienced are shown on either side of the passivation region 505.

Removing oxygen would, of course, deny the opportunity for corrosion to occur while injection of hydrogen so as to reduce the electrochemical potential may be sufficient to bring the wafer-contacting fluid media into the passivation region, herein defined as a region in which stoppage of any ongoing corrosion which has already occurred. With reference to FIG. 9, it may be further necessary to lower the pH below a value roughly equal to 8 in order to achieve desired operation in the passivation region 505. With pH adjustment by acid injection across the semi-permeable membrane, or acid spiking directly into the treatment tank, operations in the vicinity of arrows 502 and 504 are made possible.

When pH adjustment is necessary, it is preferred that the aqueous media, is "spiked" with a relatively weak acid, such as acetic acid or ammonium phosphate. Only relatively small quantities of acetic acid have been found to be necessary in a commercial production environment. For example, it is estimated that one gallon of acetic acid will satisfactorily treat as many as 50 to 100 production runs wherein semiconductor wafers are immersed within a cascade immersion arrangement of FIGS. 3 and 4. When acid is to be introduced through the semi-permeable membrane the following gases, $CO_2$, $H_2S$, CO, $NO_2$, or liquids such as acetic acid or ammonium phosphate may be used.

Operation in the passivation region is associated with the formation of at least a relatively thin oxide coating on the metal structures, which would increase the surface resistivity of those structures. A passivation coating is sometimes preferred since it is seen to provide a protective coating preventing further oxidation, should operating conditions change. Other manufacturers of electronic components prefer operation in the immunity region where oxidation is not allowed to occur and where contact resistance is the lowest attainable. With further reduction of the electrochemical potential it may be possible to achieve operation in the immunity zone illustrated at the bottom of FIG. 9, a four-sided zone 507 having corner points of ($-1.8$, 1), ($-1.8$, 4), ($-3.0$, 14) and ($-3.0$, 1). Several alternatives are possible. For example, as opposed to carrying out oxygen reduction using a semi-permeable membrane, the treatment gas may be sparged to physically drive out weakly bonded oxygen from the aqueous media. Sparging with hydrogen, for example, gives rise to a further benefit in driving reaction 8 in a reverse direction.

As mentioned, it is generally preferred that at least a portion of the treating agent in contact with the metal structure carried on the semiconductor substrate is regularly exchanged with a fresh supply. Most preferably, the exchanging step comprises a cascade overflow arrangement such as that provided in the arrangement of FIGS. 3 and 4. Adjustment to the treating agent may require only a change in electrochemical potential by injection of hydrogen or by megasonic excitation of the fluid treating agent believed to be associated with the formation of radicals in the aqueous media. Alternatively, the only adjustment required may be an adjustment to the pH of the fluid media. The present invention contemplates elimination of corrosion of metal structures carried on semiconductor substrates by automated management of the aqueous immersion operation using one or more control inputs, as explained above.

A visual examination of the metal trace surfaces carried on commercial semiconductor substrates was conducted for aluminum. Examinations of aluminum surfaces at magnifications of 20,000 and 25,000 indicate that all pitting and oxidation effects were eliminated during a series of commercial, conventional wafer treatment steps of the type employed in high volume integrated circuit production. In particular, oxidation, that is a uniform oxide growth, was not observed and the attendant increased contact resistance due to additional insulator coating was not observed with electrical tests of the conductive traces carried on a semiconductor surface. Further, pitting (a localized galvanic metal loss) was also found to be eliminated upon visual inspection and secondary evidences of pitting, such as, increased contact resistance due to roughness adhesion and oxide around surface nodules and was also found to be eliminated.

The above description is directed to aluminum metal structures carried on a semiconductor substrate and a simplified Pourbaix diagram for aluminum material was explained above with reference to FIG. 9. The principles of the present invention can be readily applied to other types of material, such as zirconium (see FIG. 10), nickel (see FIG. 11), chromium (see FIG. 12) and copper (see FIG. 13). It is anticipated that different operating strategies will be required for different metallic materials. For example, the present invention has been found to be particularly attractive when used with metallic structures of copper material since it is easier (compared to other metals) to reduce the electrochemical potential of the copper so as to allow operation in the immunity region.

Figure 10:
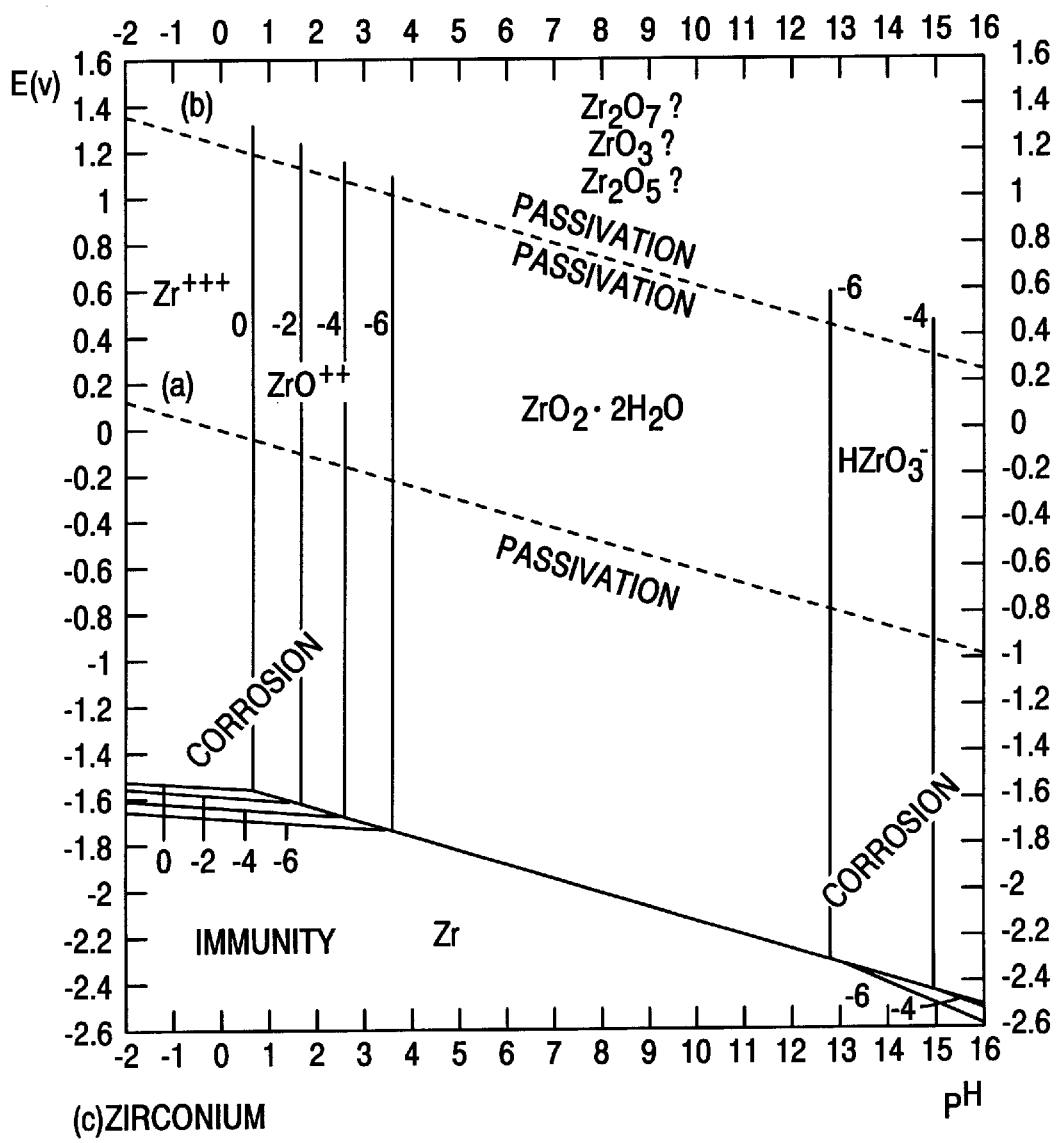

With reference to FIG. 10, the preferred passivation operating regions for zirconium are bounded by the (electrochemical, pH) coordinates of ($-1.7$, 3.5), (1.6, 3.5), (1.6, 12.8) and ($-2.23$, 12.8) and the immunity region is defined by the coordinates ($-2.6$, $-2$), ($-1.68$, $-2$), ($-2.59$, 16) and ($-2.6$, 16).

Figure 11:
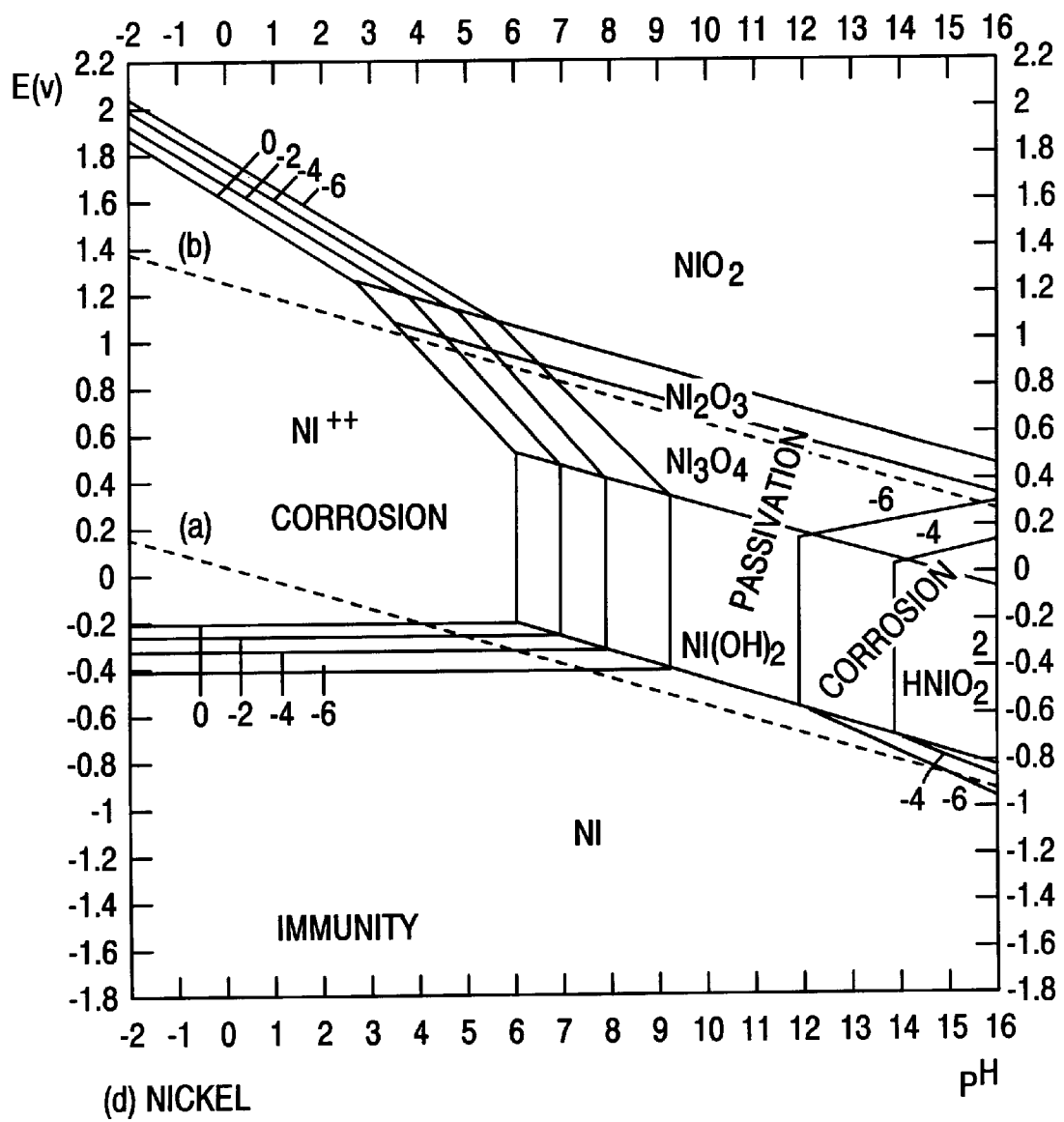

With reference to FIG. 11, the preferred passivation operating regions for nickel are bounded by the (electrochemical, pH) coordinates of ($-0.4$, 9.2), (2.2, $-2$), (2.2, 16) and ($-0.6$, 11.8) and the immunity region is defined by the coordinates ($-1.8$, $-2$), ($-0.4$, $-2$), ($-0.9$, 16) and ($-1.8$, 16).

Figure 12:
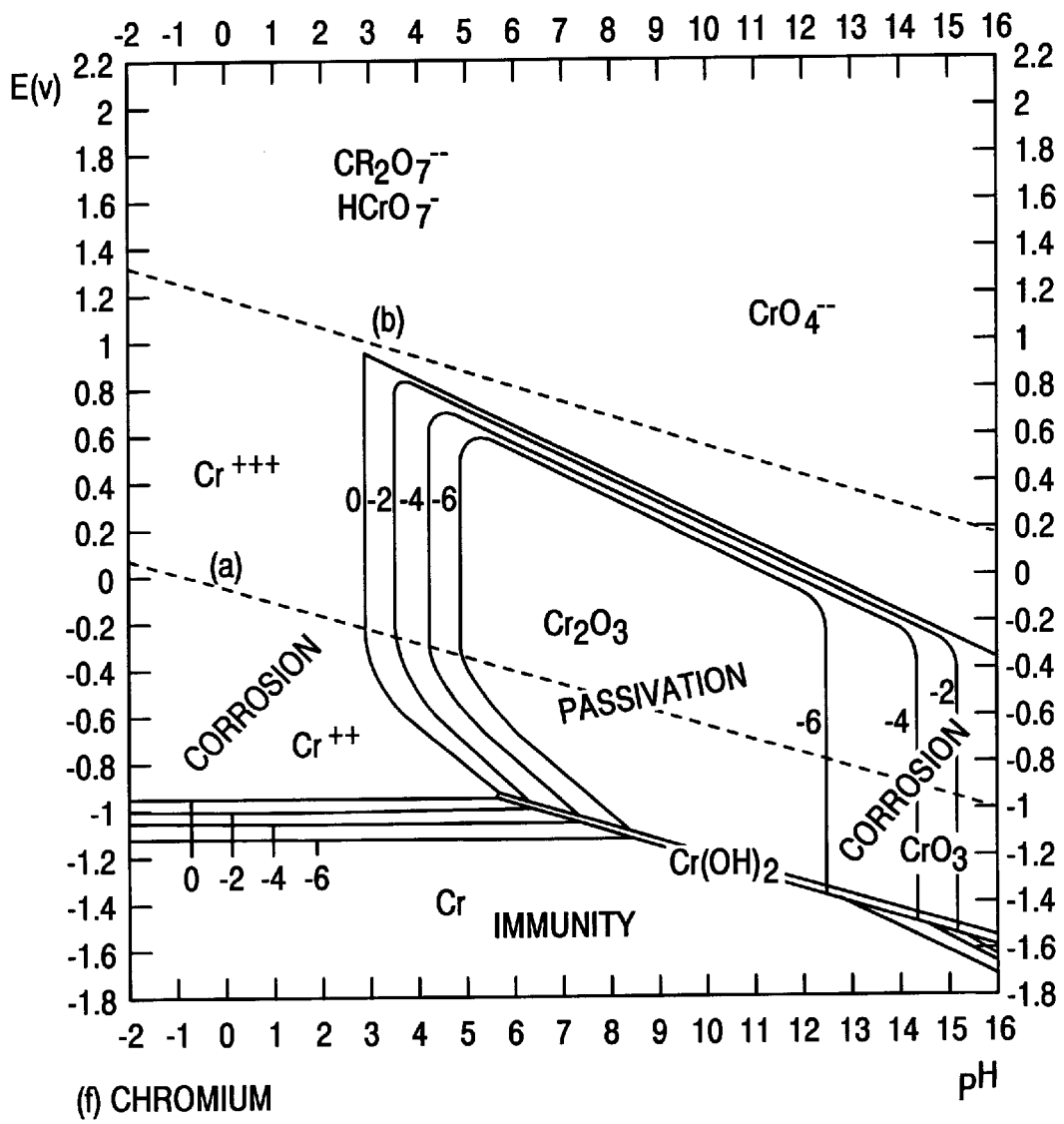

With reference to FIG. 12, the preferred passivation operating regions for chromium are bounded by the (electrochemical, pH) coordinates of ($-1.1$, 8,5), (0.6, 4.8), ($-0.18$, 12,5) and ($-1.4$, 12.5) and the immunity region is defined by the coordinates ($-1.8$, $-2$), ($-1.15$, $-2$), ($-1.7$, 16) and ($-1.8$, 16).

Figure 13:
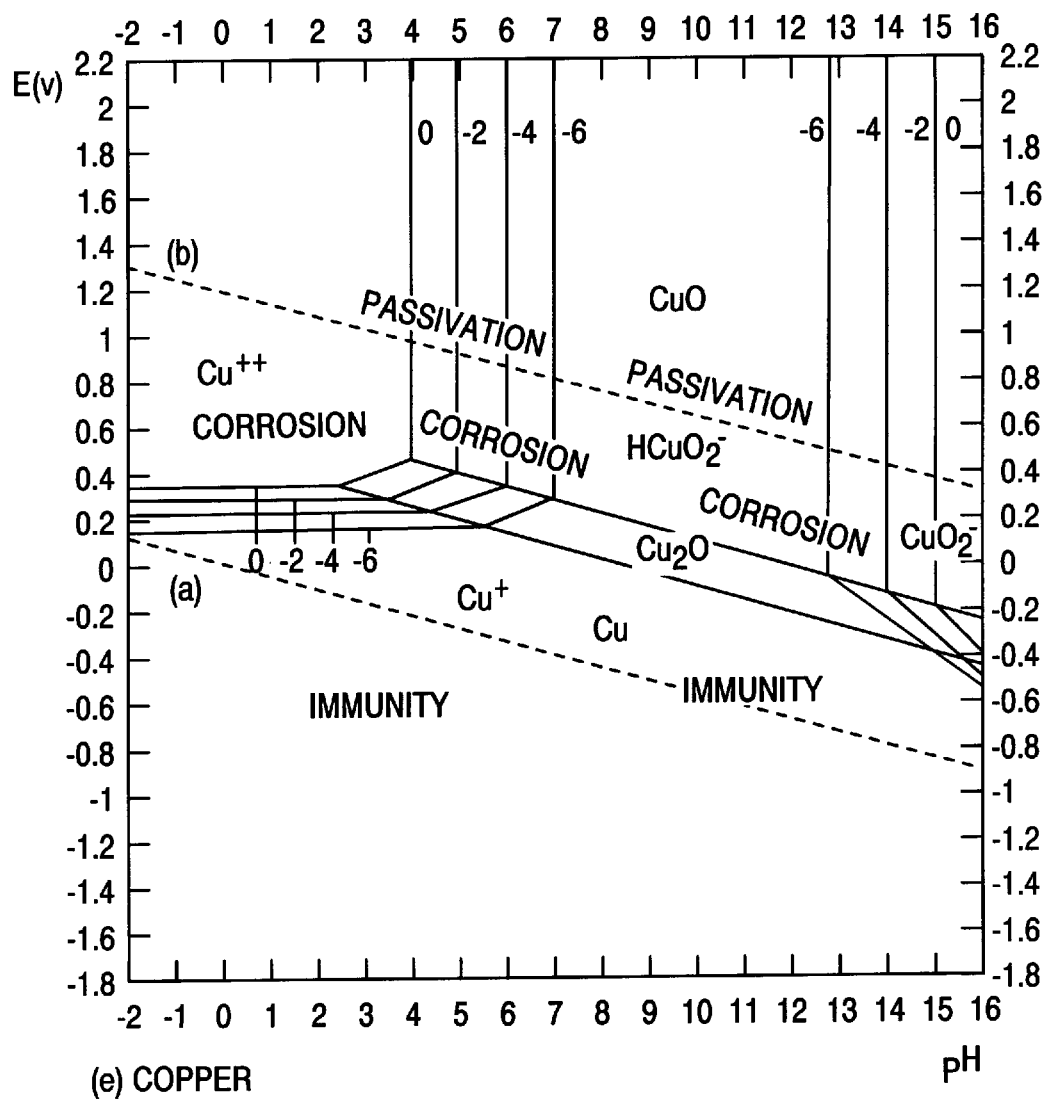

With reference to FIG. 13, the preferred passivation operating regions for copper are bounded by the (electrochemical, pH) coordinates of (0.18, 52), (0.25, 7), (0.1, 12.7) and (−0.4, 14.5) and the immunity region is defined by the coordinates (−1.8, −2), (0.18, −2), (0.57, 16) and (−1.8, 16).

It will now become apparent that the second treatment method of the present invention offers a particular advantage when used in cascade immersion operations where complex, non-uniform condition of the solution has heretofore made satisfactory corrosion control difficult, if not impossible. The present invention has been shown to provide a satisfactory control for cascade immersion-type operations employing aqueous media to treat semiconductor surfaces bearing aluminum, copper and other metallic circuit components. The present invention employs one or more corrective steps, preferably implemented by a semi-permeable osmotic membrane treating the wafer-contacting solution. In a first remedial step, an oxygen poor gas is passed across an osmotic membrane to draw oxygen from the solution. In a second remedial step a hydrogen rich gas is employed with the semi-permeable membrane to inject hydrogen into the wafer-contacting fluid media. A third remedial step, which can be deployed with or without the use of the semi-permeable membrane, is the spiking of the wafer-contacting media with a weak acid so as to lower its solution pH value. In a fourth remedial step, the wafer-contacting media is energized with ultrasonic and preferably megasonic energy to not only enhance the cleaning action, but to also reduce the electrochemical potential of the fluid media. One or more of the four remedial steps may be employed in a particular wafer fabrication operation. With the present invention, operation in the immunity or passivation regions is possible.

As will be seen below, the present invention will be described with reference to the processing of semiconductor wafers, although it will become readily apparent to those skilled in the art that other types of workpieces other than semiconductor wafers and immersion processing other than aqueous cleaning and/or rinsing of semiconductor wafers is also encompassed within the scope of the present invention. For example, the present invention is readily adaptable to a wide range of commercially significant activities, such as the photographic processing of plates, films and prints, and the fabrication of liquid crystal and flat panel displays, as well as articles requiring highly refined surface finishes, such as hard disk memory substrates.

It is generally preferred that apparatus according to the present invention be provided with detection systems for detecting the chemical composition of each component of the treatment fluid employed (e.g., commercially ACT935, EKC265, and EKC830) and to predict the time remaining before the treatment fluid goes out of specification (predefined by the user) and hence requiring a change over of the treatment fluid.

The drawings and the foregoing descriptions are not intended to represent the only forms of the invention in regard to the details of its construction and manner of operation. Changes in form and in the proportion of parts, as well as the substitution of equivalents, are contemplated as circumstances may suggest or render expedient; and although specific terms have been employed, they are intended in a generic and descriptive sense only and not for the purposes of limitation, the scope of the invention being delineated by the following claims.

What is claimed is:

1. Method of treating metal structures carried on semiconductor substrates, comprising the steps of:

immersing the semiconductor substrate in a tank filled with fluid media;

exchanging at least a portion of the fluid media in contact with the metal structure carried on the semiconductor substrate with fluid media located outside the tank;

contacting said fluid media with a semipermeable osmotic membrane;

contacting said semipermeable osmotic membrane with a treatment fluid so as to draw oxygen from said fluid media to said treatment fluid to prevent oxidation of said metal structures; and reducing the electrochemical potential of said fluid media so as to prevent corrosion reactions in said fluid media.

2. The method of claim 1 wherein the reducing step comprises at least one of said drawing of hydrogen from said treatment fluid to said fluid media to prevent hydrogen producing corrosion reactions in said fluid media, and said ultrasonic excitation of said fluid media.

3. The method of claim 1 further comprising the step of reducing the pH of the fluid media.

4. The method of claim 3 wherein the step of reducing the pH of the fluid media comprises at least one of said adding an acid to said fluid media and said providing said treatment fluid with an acid component and diffusing said acid component across said semipermeable osmotic membrane.

5. The method of claim 1 further comprising the steps of:

monitoring the pH of the fluid media in contact with the metal structure carried on the semiconductor substrate; and adjusting the pH of said treatment fluid in response to said monitoring step so as to maintain the pH of the fluid media within a preselected range.

6. The method of claim 1 wherein said reducing step comprises:

monitoring the electrical potential of the fluid media in contact with the metal structure carried on the semiconductor substrate; and contacting said semipermeable osmotic membrane with said treatment fluid in response to said monitoring step so as to maintain the electrical potential of the fluid media within a preselected range sufficient to maintain the metal structure in either the passivation operating region or the immunity operating region as defined by the Pourbaix diagram for the metal of said metal structures.

7. The method of claim 6 wherein the metal is taken from a group comprising aluminum, copper, zirconium, nickel and chromium.

8. The method of claim 1 further comprising the steps of:

monitoring the pH of the fluid media in contact with the metal structure carried on the semiconductor substrate; and adjusting the pH of said treatment fluid in response to said monitoring step so as to maintain the pH of the fluid media within a preselected range sufficient to maintain the metal structure in either the passivation operating region or the immunity operating region as defined by the Pourbaix diagram for the metal of said metal structures.

9. The method of claim 8 wherein the metal is taken from a group comprising aluminum, copper, zirconium, nickel and chromium.

10. The method of claim 1 further comprising the steps of:

monitoring the electrical potential and pH of the fluid media in contact with the metal structure carried on the semiconductor substrate; and either contacting said semipermeable osmotic membrane with said treatment fluid in response to said monitoring step so as to maintain the electrical potential of the fluid media within a preselected range sufficient to maintain the metal structure in either the Pourbaix passivation operating region or the Pourbaix immunity region, or adjusting the pH of said treatment fluid in response to said monitoring step so as to maintain the pH of the fluid media within a preselected range sufficient to maintain the metal structure in either the passivation operating region or the immunity operating region as defined by the Pourbaix diagram for the metal of said metal structures, or both.

11. The method of claim 1 wherein said exchanging step comprises a cascade overflow.

12. The method of claim 1 wherein said treatment fluid comprises a gas comprising at least two components.

13. The method of claim 1 wherein said treatment fluid comprises a single component gas.

14. The method of claim 1 wherein said treatment fluid comprises forming gas ($N_2+H_2$).

15. The method of claim 1 wherein said treatment fluid comprises a liquid comprising at least two components.

16. The method of claim 1 wherein said treatment fluid comprises a single component liquid.

17. The method of claim 1 wherein said treatment fluid has a gas component and a liquid component.

18. The method of claim 1 wherein said gas component comprises forming gas ($N_2H_2$).

19. Method of treating metal structures carried on semiconductor substrates, comprising the steps of:
    immersing the semiconductor substrate in a tank filled with fluid media;
    exchanging at least a portion of the fluid media in contact with the metal structure carried on the semiconductor substrate;
    contacting said fluid media with a semipermeable osmotic membrane; and
    contacting said semipermeable osmotic membrane with a treatment fluid so as to draw oxygen from said fluid media to said treatment fluid to prevent oxidation of said metal structures while drawing hydrogen from said treatment fluid to said fluid media to reduce the electrochemical potential of said fluid media and to prevent hydrogen producing corrosion reactions in said fluid media.

20. The method of claim 19 further comprising the step of ultrasonically exciting said fluid media so as to reduce the electrochemical potential of said fluid media.

21. The method of claim 19 further comprising the step of reducing the pH of the fluid media.

22. The method of claim 21 wherein the step of reducing the pH of the fluid media comprises adding an acid to said fluid media.

23. The method of claim 21 wherein the step of reducing the pH of the fluid media comprises providing said treatment fluid as an acid diffusible across said semipermeable osmotic membrane.

24. The method of claim 19 further comprising the steps of:
    monitoring the electrical potential of the fluid media in contact with the metal structure carried on the semiconductor substrate; and
    contacting said semipermeable osmotic membrane with said treatment fluid in response to said monitoring step so as to maintain the electrical potential of the fluid media within a preselected range.

25. The method of claim 19 further comprising the steps of:
    monitoring the pH of the fluid media in contact with the metal structure carried on the semiconductor substrate; and
    adjusting the pH of said treatment fluid in response to said monitoring step so as to maintain the pH of the fluid media within a preselected range.

26. The method of claim 19 further comprising the steps of:
    monitoring the electrical potential of the fluid media in contact with the metal structure carried on the semiconductor substrate; and
    contacting said semipermeable osmotic membrane with said treatment fluid in response to said monitoring step so as to maintain the electrical potential of the fluid media within a preselected range sufficient to maintain the metal structure in either the passivation operating region or the immunity operating region as defined by the Pourbaix diagram for the metal of said metal structures.

27. The method of claim 26 wherein the metal is taken from a group comprising aluminum, copper, zirconium, nickel and chromium.

28. The method of claim 19 further comprising the steps of:
    monitoring the pH of the fluid media in contact with the metal structure carried on the semiconductor substrate; and
    adjusting the pH of said treatment fluid in response to said monitoring step so as to maintain the pH of the fluid media within a preselected range sufficient to maintain the metal structure in either the passivation operating region or the immunity operating region as defined by the Pourbaix diagram for the metal of said metal structures.

29. The method of claim 28 wherein the metal is taken from a group comprising aluminum, copper, zirconium, nickel and chromium.

30. The method of claim 19 further comprising the steps of:
    monitoring the electrical potential and pH of the fluid media in contact with the metal structure carried on the semiconductor substrate; and
    either contacting said semipermeable osmotic membrane with said treatment fluid in response to said monitoring step so as to maintain the electrical potential of the fluid media within a preselected range sufficient to maintain the metal structure in either the Pourbaix passivation operating region or the Pourbaix immunity region or adjusting the pH of said treatment fluid in response to said monitoring step so as to maintain the pH of the fluid media within a preselected range sufficient to maintain the metal structure in either the passivation operating region or the immunity operating region as defined by the Pourbaix diagram for the metal of said metal structures, or both.

31. The method of claim 19 wherein said exchanging step comprises a cascade overflow.

32. The method of claim 19 wherein said treatment fluid comprises a gas comprising at least two components.

33. The method of claim 19 wherein said treatment fluid comprises a single component gas.

34. The method of claim 19 wherein said treatment fluid comprises forming gas ($N_2+H_2$).

35. The method of claim 19 wherein said treatment fluid comprises a single component liquid.

36. The method of claim 19 wherein said treatment fluid has a gas component and a liquid component.

37. The method of claim 19 wherein said gas component comprises forming gas ($N_2+H_2$).

38. The method of claim 19 further comprising the step of drying the said semiconductor substrate by emptying the tank of said fluid media and passing fluid over the surfaces of said semiconductor substrate.

39. The method of claim 38 wherein said step of drying said semiconductor substrate further comprises the step of spraying a rinse chemical, at least partly non-aqueous, on the major surfaces of said semiconductor substrate.

40. The method of claim 38 wherein said step of drying said semiconductor substrate further comprises the step of forming a cloud of isopropyl alcohol above the semiconductor substrate.

41. The method according to claim 40 further comprising the steps of:

providing a process cover with heater means for heating the process cover;

providing a drying cover with means for directing a stream of drying gas;

providing said tank with a device opening through which said semiconductor substrate is passed into and out of said cavity;

covering said device opening with said process cover during treatment of said semiconductor substrate; and withdrawing said process cover from said device opening and covering said device opening with said drying cover during drying of said semiconductor substrate.

42. Method of treating metal structures carried on semiconductor substrates, comprising the steps of:

immersing the semiconductor substrate in a tank filled with fluid media;

exchanging at least a portion of the fluid media in contact with the metal structure carried on the semiconductor substrate with fluid media located outside the tank;

contacting said fluid media with a semipermeable osmotic membrane;

contacting said semipermeable osmotic membrane with a treatment fluid so as to draw oxygen from said fluid media to said treatment fluid to prevent oxidation of said metal structures;

monitoring the pH of the fluid media in contact with the metal structure carried on the semiconductor substrate; and adjusting the pH of said treatment fluid in response to said monitoring step so as to maintain the pH of the fluid media within a preselected range sufficient to maintain the metal structure in either the passivation operating region or the immunity operating region as defined by the Pourbaix diagram for the metal of said metal structures.

43. The method of claim 42 wherein the metal is taken from a group comprising aluminum, copper, zirconium, nickel and chromium.

44. Apparatus for treating metal structures carried on semiconductor substrates, comprising:

an immersion tank for filling with a fluid media;

a support within the tank for supporting said substrate for immersion in said fluid media;

a fluid exchange system for exchanging at least a portion of the fluid media in contact with the metal structure carried on the semiconductor substrate;

a treatment fluid for drawing oxygen from said fluid media and for supplying hydrogen to said fluid media;

an osmotic membrane having a first inlet for said fluid media and a second inlet for said treatment fluid, said membrane semipermeable to oxygen in said fluid media so as to draw oxygen from said fluid media to said treatment fluid to prevent oxidation of said metal structures and said membrane semipermeable to said treatment fluid media so as to diffuse hydrogen into said fluid media to prevent hydrogen producing corrosion reactions in said fluid media.

45. The apparatus of claim 44 further comprising means in communication with said immersion tank for the ultrasonic excitation of said fluid media contained in said immersion tank.

46. The apparatus of claim 44 further comprising means for adding an acid to said fluid media.

47. The apparatus of claim 44 further comprising at least one cover connected to said treatment chamber to cover said device opening.

48. The apparatus according to claim 47 further comprising fluid blanket means for inserting a gas blanket enclosed within said cavity.

49. The apparatus according to claim 48 wherein said fluid blanket means is disposed in one of said covers.

50. The apparatus according to claim 49 wherein said fluid blanket means is at least partially comprised of carbon dioxide gas.

51. The apparatus of claim 47 wherein at least one of said covers is light blocking.

52. The apparatus of claim 47 wherein one of said covers includes a heater means to prevent condensation.

53. The apparatus of claim 47 wherein one of said covers includes means for injecting a rinse agent into said chamber.

54. The apparatus of claim 47 wherein said at least one cover further includes means for directing a drying gas into said chamber.

55. The apparatus of claim 44 wherein said treating fluid comprises a composition of first and second gases and said flow control means comprises means for controlling the flow of each of said components.

56. The apparatus of claim 44 wherein said treating fluid comprises one of said ACT935, said EKC265 and said EKC830, said apparatus further comprising means for the detecting the chemical composition of each component of the treating fluid and to determine, based upon the chemical composition detected, the time period remaining before the treating fluid exceeds a pre-defined threshold.

* * * * *